(12) United States Patent
Stilwell

(10) Patent No.: US 9,100,022 B2
(45) Date of Patent: Aug. 4, 2015

(54) TOUCH RESPONSIVE USER INTERFACE WITH BACKLIT GRAPHICS

(71) Applicant: TOUCHSENSOR TECHNOLOGIES, LLC, Wheaton, IL (US)

(72) Inventor: Thomas R. Stilwell, Wheaton, IL (US)

(73) Assignee: TOUCHSENSOR TECHNOLOGIES, LLC, Wheaton, IL (US)

(*) Notice: Subject to any disclaimer, the term of this patent is extended or adjusted under 35 U.S.C. 154(b) by 148 days.

(21) Appl. No.: 13/800,231

(22) Filed: Mar. 13, 2013

(65) Prior Publication Data

US 2013/0248344 A1   Sep. 26, 2013

Related U.S. Application Data

(60) Provisional application No. 61/614,970, filed on Mar. 23, 2012.

(51) Int. Cl.
*H03K 17/975* (2006.01)
*H03K 17/96* (2006.01)

(52) U.S. Cl.
CPC ............ *H03K 17/962* (2013.01); *H03K 17/975* (2013.01); *H03K 2217/96079* (2013.01); *H03K 2217/960755* (2013.01); *H03K 2217/960765* (2013.01); *H03K 2217/960775* (2013.01)

(58) Field of Classification Search
CPC ......... H03K 17/975; H01H 1/00; H01H 5/00; H01H 5/04; H01H 9/02; H01H 2021/00; H01H 2013/00; H01H 2203/026; H01H 2203/03; H01H 2029/024; H01H 2029/06
USPC .......................................... 200/600; 345/173
See application file for complete search history.

(56) References Cited

U.S. PATENT DOCUMENTS

| | | |
|---|---|---|
| 3,701,869 A | 10/1972 | Jacob et al. |
| 4,163,883 A | 8/1979 | Boulanger |
| 4,288,672 A | 9/1981 | Puccini |
| 4,855,550 A | 8/1989 | Schultz |
| 5,239,152 A | 8/1993 | Caldwell et al. |
| 5,408,060 A | 4/1995 | Muurinen |
| 5,491,314 A | 2/1996 | Dorsey |

(Continued)

FOREIGN PATENT DOCUMENTS

| | | |
|---|---|---|
| DE | 19714195 | 10/1998 |
| DE | 19744791 | 4/1999 |

(Continued)

OTHER PUBLICATIONS

International Search Report and Written Opinion issued in International Patent Application No. PCT/US2013/031198, dated Jun. 26, 2013.

(Continued)

*Primary Examiner* — Edwin A. Leon
*Assistant Examiner* — Anthony R. Jimenez
(74) *Attorney, Agent, or Firm* — Barnes & Thornburg LLP

(57) ABSTRACT

A user interface includes a touch surface substrate, a graphic layer, a touch sensor disposed on a circuit carrier associated with the rear side of the touch surface substrate, and a light source associated with the rear side of the circuit carrier. The circuit carrier defines an aperture through which light emanating from the light source can pass. This light also passes through the graphic layer and is visible at the front side of the touch surface substrate.

17 Claims, 5 Drawing Sheets

(56) References Cited

U.S. PATENT DOCUMENTS

| | | | |
|---|---|---|---|
| 5,598,527 | A | 1/1997 | Debrus et al. |
| 5,847,336 | A | 12/1998 | Thornton |
| 5,917,165 | A | 6/1999 | Platt et al. |
| 6,016,134 | A | 1/2000 | Ota |
| 6,137,072 | A | 10/2000 | Martter et al. |
| 6,403,904 | B1 | 6/2002 | Schilling |
| 6,664,489 | B2 | 12/2003 | Kleinhans |
| 6,897,390 | B2 | 5/2005 | Caldwell et al. |
| 7,098,414 | B2 | 8/2006 | Caldwell |
| 7,175,304 | B2 | 2/2007 | Wadia et al. |
| 7,242,393 | B2 | 7/2007 | Caldwell |
| 7,906,875 | B2 * | 3/2011 | Caldwell et al. ............. 307/139 |
| 2003/0122794 | A1 | 7/2003 | Caldwell |
| 2007/0285917 | A1 | 12/2007 | Wadia |
| 2008/0202912 | A1 | 8/2008 | Boddie et al. |
| 2008/0246735 | A1 * | 10/2008 | Reynolds et al. ............. 345/173 |
| 2009/0057124 | A1 * | 3/2009 | Orsley et al. .................. 200/600 |
| 2009/0091906 | A1 | 4/2009 | Arione et al. |
| 2009/0115645 | A1 * | 5/2009 | Roth .............................. 341/33 |
| 2010/0259497 | A1 | 10/2010 | Livingston et al. |
| 2011/0037624 | A1 | 2/2011 | Pance et al. |
| 2011/0285666 | A1 * | 11/2011 | Poupyrev et al. ............. 345/174 |

FOREIGN PATENT DOCUMENTS

| | | |
|---|---|---|
| DE | 19817195 | 9/1999 |
| DE | 19828978 | 12/1999 |
| DE | 102006022965 | 11/2007 |
| EP | 1542363 | 6/2005 |
| EP | 1850482 | 10/2007 |
| JP | 4082416 | 3/1992 |
| WO | WO 03/044957 | 5/2003 |

OTHER PUBLICATIONS

TouchSensor Technologies, LLC Reference A., a photograph believed to be representative of an item sold at least as early as Apr. 8, 2008.

TouchSensor Technologies, LLC Reference B., a photograph believed to be representative of an item sold at least as early as Apr. 8, 2008.

Int'l Search Report and Written Opinion issued Jan. 5, 2011, in Appl. No. PCT/US10/30537.

* cited by examiner

TOUCH RESPONSIVE USER INTERFACE WITH BACKLIT GRAPHICS

CROSS-REFERENCE TO RELATED APPLICATION

This application claims priority to U.S. Provisional Application No. 61/614,970, filed on Mar. 23, 2012, the disclosure of which is incorporated herein by reference in its entirety.

BACKGROUND

Touch responsive user interfaces with backlit graphics are known in the art. Such user interfaces typically include a touch surface substrate that presents visual information to the user and provides an operative touch surface for the user to touch in order to actuate underlying touch sensors associated with the back side of the touch surface substrate. The touch surface substrate typically is made of glass or plastic and can be decorated to identify the locations and functions of the underlying sensors. The touch sensors typically include one or more sensor electrodes and associated control circuitry.

Alternatively, the locations and functions of the underlying touch sensors can be defined by a graphics layer associated with the back side of the touch surface substrate and one or more underlying light sources. The graphics layer typically is a substantially opaque layer having light-transmissive portions (which may be transparent or translucent) in registration with corresponding touch sensor sensing electrodes and light sources. The transparent portions of the graphics layer define indicia or other graphic elements that are visible at the touch surface when backlit by the light sources.

The light sources typically are disposed on the back surface of the printed wiring board (the surface opposite the touch surface substrate) or on a separate lighting board attached to the back surface of the printed wiring board. In order that light emanating from the light sources may reach the touch surface substrate and be visible to the user, at least the portions of the printed wiring board and touch sensor electrodes disposed in the optical path between the light source and the touch surface substrate must be substantially transparent.

One skilled in the art would know how to select such a printed wiring board and how to dispose substantially transparent sensor electrodes thereon. However, known printed wiring boards and techniques for disposing transparent touch sensor electrodes thereon have limitations. For example, the materials used to form transparent electrodes typically are expensive. Also, transparent sensor electrodes may have lesser conductivity than electrodes made of conventional, opaque materials and, therefore, may adversely affect sensor performance. Similarly, transparent wiring boards can be more expensive than opaque boards. Also, light projected through known transparent or translucent substrates typically is at least somewhat attenuated and can take on an undesirable hue. Further, light admitted into a printed wiring board may bleed laterally through the board, resulting in an undesired aura of light about the area of the touch substrate that is intended to be backlit, and reducing the light output in the area of the touch substrate that is intended to be backlit.

DETAILED DESCRIPTION OF THE DRAWINGS

Figure 1:
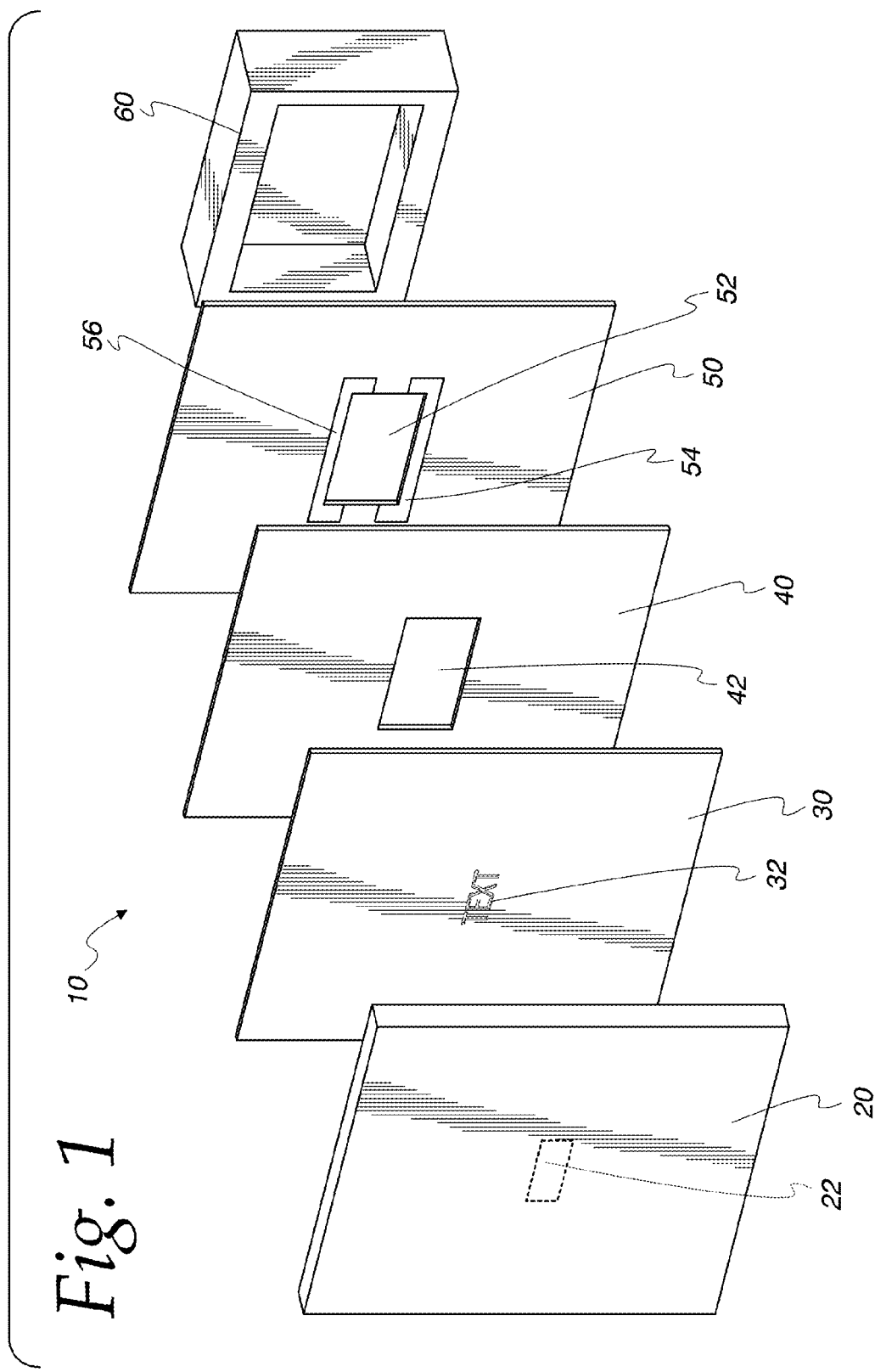
FIG. 1 is an exploded, front perspective view of an illustrative backlit user interface 10 including a touch surface substrate 20, a graphics layer 30, an adhesive layer 40, a circuit carrier 50 defining an aperture 52 therein and having a sensor including a first sensor electrode 54 and a second sensor electrode 56 disposed on a first side thereof, and a reflector 60.
Figure 2:
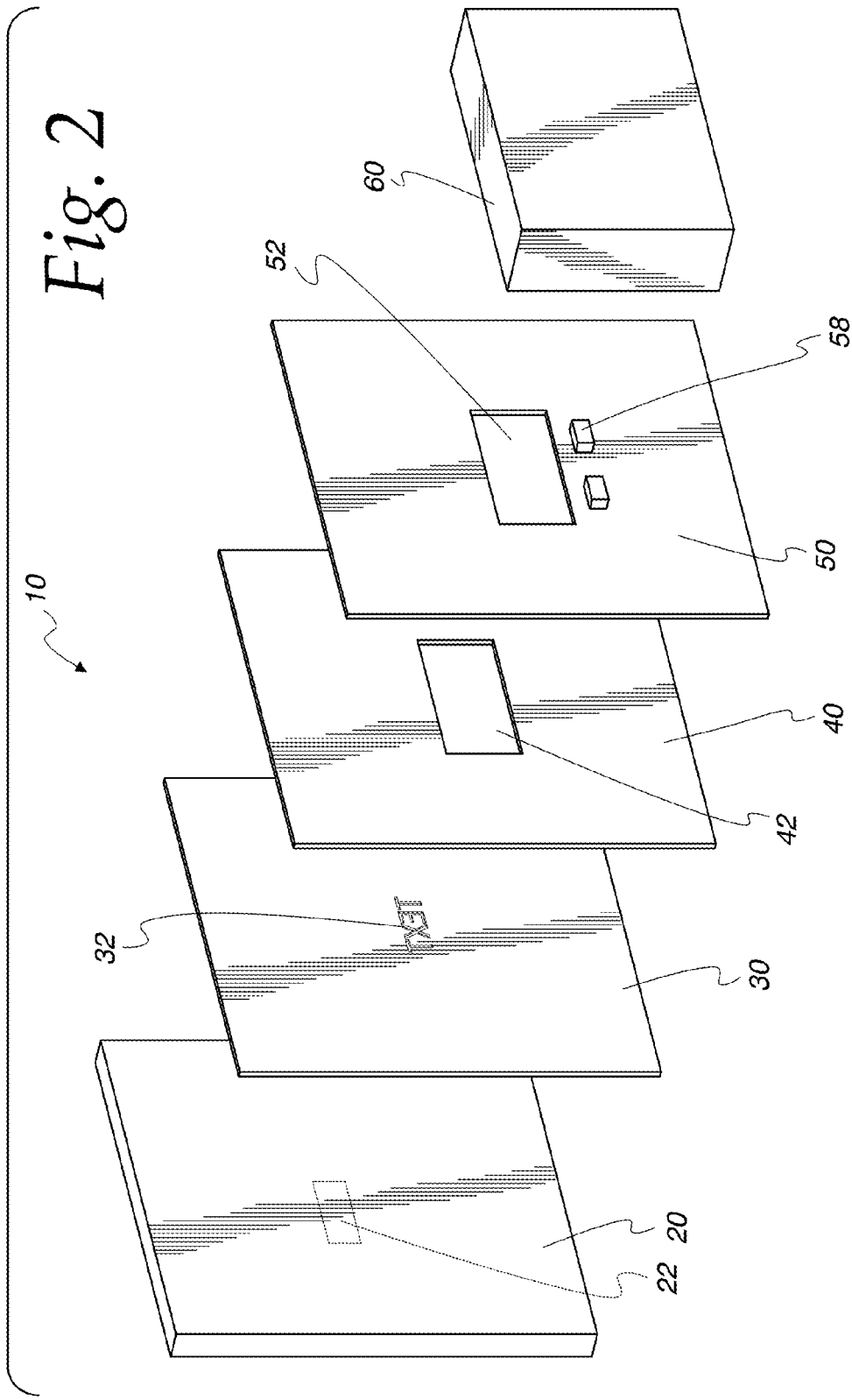
FIG. 2 is a exploded, rear perspective view of user interface 10 further including LEDs 58 on a second surface of circuit carrier 50.
Figure 3:
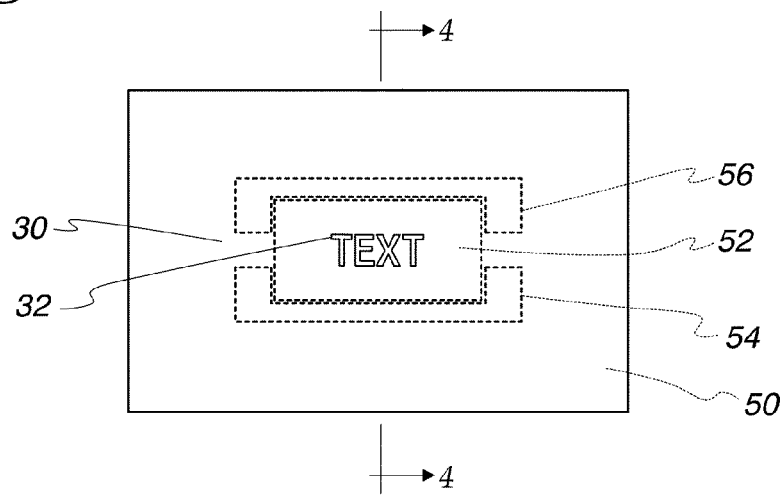
FIG. 3 is a plan view of a portion of user interface 10 showing circuit carrier 50, first electrode 54, second electrode 56, aperture 52, and graphics layer 30.

The drawings show illustrative embodiments of a user interface 10 including a touch surface substrate 20, a graphics layer 30, an optional adhesive layer 40, a circuit carrier 50, and a reflector 60. Touch surface substrate 20 has a front side and a rear side. A portion of the front side of touch surface substrate 20 defines an operative touch surface 22. Graphics layer 30 defines a graphic element 32. Circuit carrier 50 also has a front side and a rear side. The front side of circuit carrier 50 is associated with the rear side of touch surface substrate 20. Circuit carrier 50 defines an aperture 52. A sensor including first sensor electrode 54 and a second sensor electrode 56 is disposed on the front side of circuit carrier 50 about and adjacent to aperture 52. Circuit carrier 50 also bears an LED 58 or other form of light source disposed on the rear side thereof. Operative touch surface 22, graphic element 32, aperture 42 and sensor electrodes 54 and 56 correspond to and generally are aligned or in at least partial registration with each other.

Touch surface substrate 20 could be made of plastic or glass or another suitable material, as would be recognized by one skilled in the art. Graphics layer 30 could be applied directly to touch surface substrate 20 using any suitable technique, as would be recognized by one skilled in the art. For example, graphics layer 30 could be screen printed, ink jet printed, digitally printed, or otherwise directly applied to touch surface substrate 20. Alternatively, graphics layer 30 could be formed as a separate layer post-attached to touch surface substrate 20. For example, graphics layer 30 could be a film decorated using any suitable technique to form graphic element 32. The decorated film could be applied to touch surface substrate 20 using adhesives or any other suitable technique. In any of the foregoing embodiments, graphics layer 30 could be applied to either side of touch surface substrate 20. As a further alternative, graphic element 32 could be integrally formed into touch surface substrate 20. Such an embodiment need not include a discrete graphics layer 30. Graphic element 32 could have any desired geometric form. For example, without limitation, graphic element 32 could be a word, letter, number, curvilinear and/or angular shape, icon, etc.

Circuit carrier 50 has a front side and a rear side. The front side of circuit carrier 50 faces the rear side of touch surface substrate 20. Circuit carrier 50 could be embodied as a printed wiring board, a flexible circuit carrier or in any other suitable form, as would be understood by one skilled in the art. Circuit carrier 50 can, but need not, be substantially opaque.

Circuit carrier 50 defines an aperture 52 therein. Aperture 52 could be formed by punching, cutting or otherwise removing material from circuit carrier 50. Alternatively, circuit carrier 50 could be formed with aperture 52 therein. Aperture 52 is illustrated as a rectangular aperture generally sized, shaped and aligned with graphic element 32 such that the projection of graphic element 32 onto circuit carrier 50 generally could be contained within the confines of aperture 52. In some embodiments, aperture 52 could be larger or smaller, have other shapes and/or could be otherwise aligned with graphic element 32. Preferably, a gap of about 2 mm (or more or less) exists between the periphery of graphic element 32 and corresponding edges of aperture 52. The interior periphery of aperture 52 could, but need not, be coated with a reflective material to inhibit entry of stray light into circuit carrier 50 through the wall or walls defined by aperture 52.

Figure 4:
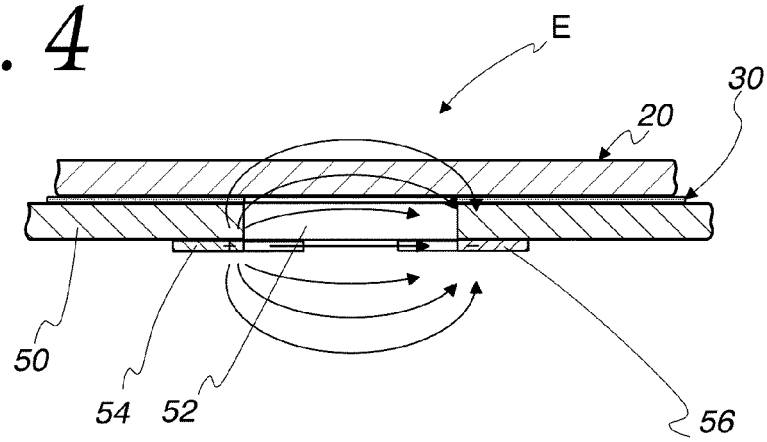
FIG. 4 is cross-sectional view of a portion of an alternative user interface 10 showing touch surface substrate 20, graphics layer 30, circuit carrier 50, aperture 52, first sensing electrode 54, second sensing electrode 56 and electric field E extending between first sensing electrode 54 and second sensing electrode 56 wherein first sensing electrode 54 and second sensing electrode 56 are disposed on a second side of circuit carrier 50.

The drawings generally show touch sensor electrodes 54 and 56 disposed on the front side of circuit carrier 50 proximate aperture 52. Alternatively, as shown in FIG. 4, touch sensor electrodes 54 and 56 could be disposed on the rear side of circuit carrier 50. In further embodiments, either one of touch sensor electrodes 54 and 56 could be disposed on the front side of circuit carrier 50, and the other of touch sensor electrodes 54 and 56 could be disposed on the rear side of circuit carrier 50. Touch sensor electrodes 54, 56 can, but need not, be substantially opaque.

Touch sensor electrodes 54 and 56 are illustrated as generally C-shaped and surrounding respective portions of aperture 52. The "legs" of C-shaped electrode 54 could be separated from the legs of C-shaped electrode 56, as desired. In an embodiment, the legs are separated by a gap of about 1-4 mm and preferably about 2 mm. In other embodiments, touch sensor electrodes 54 and 56 could be separated by other distances and/or have other forms. Preferably, touch sensor electrodes 54 and 56 would be located so as to create an electric field about operative touch surface 22 when in operation, as would be understood by one skilled in the art and/or as further discussed below. In some embodiments, second sensor electrode 56 could be omitted. In such embodiments, first sensor electrode 54 preferably would substantially encompass aperture 52. First sensor electrode 54 could form a closed loop, or it could be open-ended.

Touch sensor electrodes 54 and 56 are electrically coupled to a control circuit (not shown) adapted to detect proximity or touch of a stimulus, for example, a user's finger or other conductive object, to operative touch surface 22 using any suitable technique. For example, the control circuit could use a capacitive sensing technique. One skilled in the art would recognize that such techniques typically would involve excitation of one of the sensor electrodes (the "drive electrode") and thereby establishing an electric field (the "electrode capacitance") between the drive electrode and the other electrode (the "sense electrode"). FIG. 4 illustrates such an electric field E. Electric field E establishes a mutual capacitance between the drive electrode and sense electrode.

When a stimulus is introduced proximate the operative touch surface, a portion of the electric field is shunted to the stimulus, thus establishing a capacitance between the drive electrode and the stimulus (the "stimulus capacitance") and thereby diminishing the electrode capacitance. The control circuit would sense the electrode capacitance and changes thereto and thereby determine whether or not the stimulus is present. The control circuit could provide an output indicative of whether or not it deems that a stimulus is present the operative touch surface. Put another way, the control circuit could provide one or more outputs indicative of whether the sensor is in the so-called "touched" or "untouched" state. The control circuit output(s) could be used to control an associated apparatus and/or a function thereof.

The control circuit could be adapted to detect proximity or touch of a stimulus to operative touch surface 22 in other ways, as well, as would be understood by one skilled in the art. For example, in a single electrode embodiment, the control circuit could be adapted to both excite the single electrode and detect changes in capacitance between the electrode and a reference potential, as would be understood by one skilled in the art. The control circuit could be disposed on circuit carrier 50 and coupled to electrodes 54, 56 via electrical circuit traces, as would be understood by one skilled in the art. Alternatively, the control circuit could be disposed elsewhere and connected to electrodes 54, 56 using any suitable mans, as would be understood by one skilled in the art.

LED 58 is illustrated as being disposed on the rear side of circuit carrier 50. In other embodiments, LED 58 could be disposed on a separate carrier attached to or otherwise associated with the rear side of circuit carrier 50.

Reflector 60 could be provided to reflect and/or direct light emanating from LED 58 toward touch surface substrate, such that the light passes through aperture 52 and graphic element 32. Reflector 60 could be mounted to circuit carrier 50 in embodiments wherein LED 58 is disposed on circuit carrier 50. In embodiments wherein LED 58 is disposed on a separate carrier, reflector 60 could be disposed on that carrier and/or embodied as a light guide or light pipe adapted to convey light emanating from LED 58 toward and through aperture 52. In such embodiments, the light guide/pipe could further be adapted to at least partially contain the light emanating from LED 58 to a path between LED 58 and aperture 52.

Figure 5:
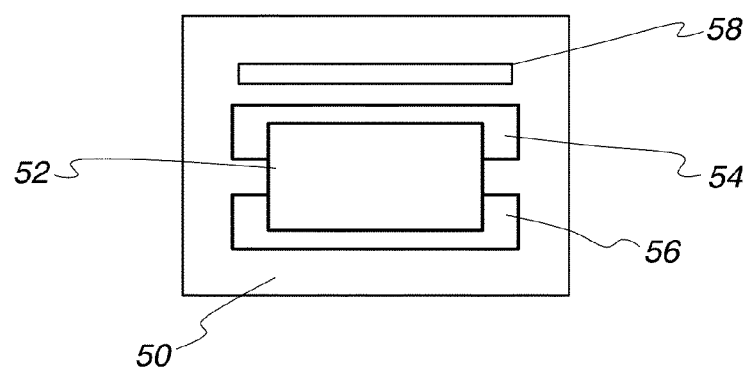
FIG. 5 is a plan view of a circuit carrier 50 defining aperture 52 and bearing sensor electrodes 54, 56 and LED 58.

One skilled in the art would recognize that sense electrode 54 could be affected by electromagnetic interference generated by LED 58 and/or circuitry powering LED 58. As such, it may be preferable, but it is not necessary, to locate LED 58 and/or its power supply circuitry such that LED 58 and/or its power supply circuitry is spatially separated from sense electrode 56 by drive electrode 54, for example, as shown in FIG. 5, or otherwise. In this arrangement, the drive electrode acts as a shield electrode, shielding sense electrode 56 from interference and/or noise emanating from LED 58 and/or its power supply circuitry. In FIG. 5, LED 58 and sensor electrodes 54, 56 are disposed on the same side of circuit carrier 50. In other embodiments, LED 58 could be disposed on the rear side of circuit carrier 50 and one or both of sensor electrodes 54, 56 could be disposed on the front side of circuit carrier 50.

Figure 6:
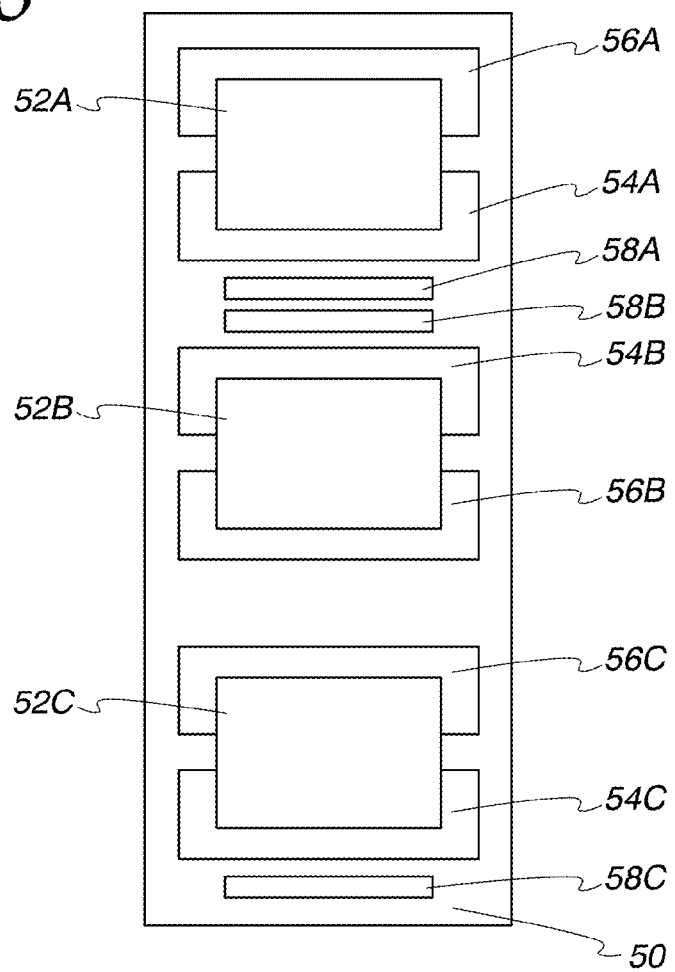
FIG. 6 is a plan view of a circuit carrier 50 defining three apertures 52A-52C and bearing three corresponding sets of sensors electrodes 54A-54C, 56A-56C and three corresponding LEDs 58A-58C.

One skilled in the art also would recognize that the sense electrode of a given touch sensor could be affected by crosstalk or interference resulting from excitation of the drive electrode of an adjacent touch sensor. FIG. 6 illustrates an array A of three touch sensors having drive electrodes 54A-54C and sense electrodes 56A-56C, respectively, arranged in a manner that could mitigate this effect. In array A, the drive and sense electrodes of the three touch sensors are arranged so that the sense electrode 56 of each particular sensor is separated from the drive electrode 54 of an adjacent sensor at least by the drive electrode 54 of the particular sensor or the sense electrode 56 of the adjacent sensor. In this arrangement, the electrode between the sense electrode of a particular sensor and the drive electrode of an adjacent sensor acts as a shield electrode. FIG. 6 also illustrates the sense electrode of each of the three sensors separated from the LED 58A-58C of the corresponding sensor or an adjacent sensor by at least the drive electrode of the corresponding sensor or the adjacent sensor. Such an arrangement is not necessary but may be preferable to mitigate interference from the LEDs and/or their control circuits at the sense electrodes.

FIG. 6 shows an array including three sensors, and the drawings generally show one LED 58 in connection with each sensor. Other embodiments could include more or fewer than three sensors in an array of sensors and/or more than one LED 58 per sensor. In such embodiments, the sensors and LEDs could be arranged in manners similar to those shown in the drawings and discussed above in order to mitigate interference and crosstalk.

Figure 7:
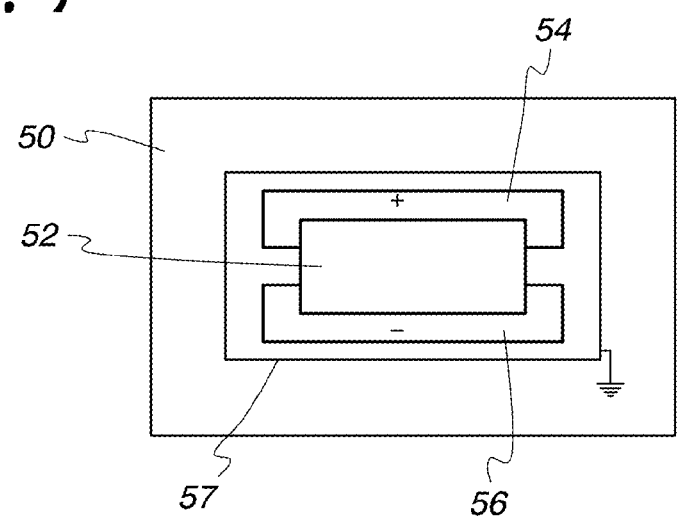
FIG. 7 is a plan view of a circuit carrier 50 defining an aperture 52 and bearing a sensor including a first sensor electrode 54, a second sensor electrode 56 and a guard electrode 57 having a first configuration.
Figure 8:
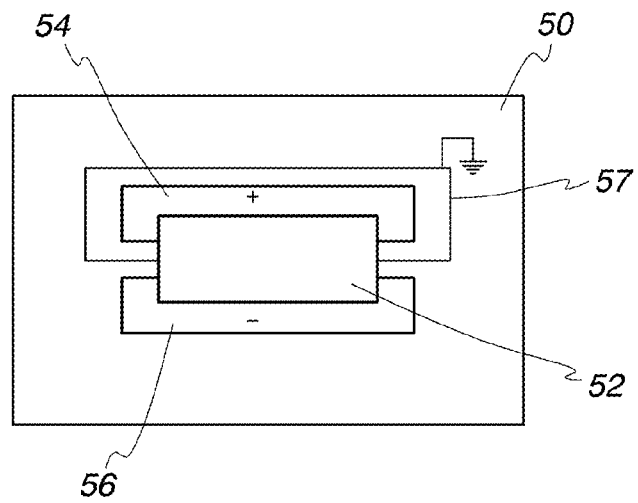
FIG. 8 is a plan view of a circuit carrier 50 defining an aperture 52 and bearing a sensor including a first sensor electrode 54, a second sensor electrode 56 and a guard electrode 57 having a second configuration.
Figure 9:
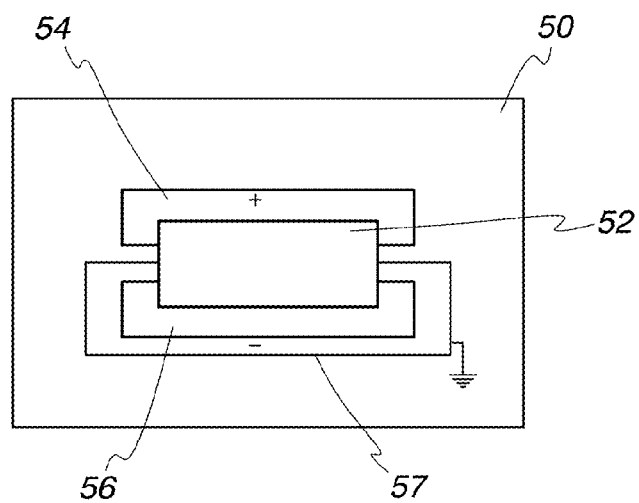
FIG. 9 is a plan view of a circuit carrier 50 defining an aperture 52 and bearing a sensor including a first sensor electrode 54, a second sensor electrode 56 and a guard electrode 57 having a third configuration.

Crosstalk between sensors also could be mitigated using a guard electrode tied to ground or another potential. FIGS. 7-9 each illustrate circuit carrier 50 defining aperture 52 and bearing a sensor including first sensor electrode 54, second sensor electrode 56 and a guard electrode 57. In FIG. 7, guard electrode 57 is shown as a complete ring completely surrounding both of first sensor electrode 54 and second sensor electrode 56, as well as aperture 52. Alternatively, guard electrode 57 could be open ended and, therefore, only partially surround first sensor electrode 54 and second sensor electrode 56. In FIG. 8, guard electrode 57 is shown as being generally adjacent three sides of first sensor electrode 54 but not adjacent second sensor electrode 56. In FIG. 9, guard electrode 57 is shown as being generally adjacent three sides of second sensor electrode 56 but not adjacent first sensor electrode 54. In other embodiments, guard electrode 57 could be configured in other ways. Guard electrode 57 is shown in FIGS. 7-9 as being on same side of circuit carrier as first sensor electrode 54 and second sensor electrode 56. In other embodiments, first sensor electrode 54 and second sensor electrode 56 could be on one side (the front side or the rear side) of circuit carrier 50 and guard electrode 57 could be on the other side of circuit carrier 50. In further embodiments, guard electrode 57 and one of first sensor electrode 54 and second sensor electrode 56 could be on one side (the front side or the rear side) of circuit carrier 50 and the other of first sensor electrode 54 and second sensor electrode 56 could be on the other side of circuit carrier 50. In embodiments omitting second electrode 56, guard electrode 57 could be provided in a manner that partially or completely surrounds first electrode 54, for example, in a manner similar to that shown in FIG. 7 or FIG. 8.

In operation, LED 58 could be selectively illuminated according to any desired criteria. The criteria could, but need not, be related to the output state of the corresponding sensor or another sensor. For example, a given LED 58 could be de-energized when the corresponding sensor is in the untouched state and in an illuminated state when the sensor is in the touched state. In another embodiment, a given LED 58 could be in a de-energized state under certain conditions, for example, when the corresponding sensor is in an "off" state or a "sleep" state, illuminated at a first intensity when the sensor is in a "wakened" but untouched state, and illuminated at a second (greater or lesser) intensity when the sensor is in a touched state. With LED 58 in any illuminated state, light emanating from LED 58 would pass through aperture 52, graphic layer 30 and touch surface substrate 20. Graphic 32 of graphic layer 30 would shape the light visible at the front side of touch surface substrate 20 to a form corresponding to the shape of graphic element 32.

One skilled in the art would recognize that the presence of aperture 52 in circuit carrier 50 could allow for use of an LED 58 or other light source of lesser intensity or lower power in a given application than might otherwise be required because the light emanating from the light source likely would suffer less attenuation traveling through aperture 52 than it might traveling through circuit carrier 50. Use of a lower powered or less intense light source could yield cost savings in manufacturing and operation of user interface 10. Also, use of a lower powered or less intense light source could reduce heat generation in user interface 10, thereby possibly extending its life or the lives of components therein.

Also, the presence of aperture 52 could enhance the performance of the sensor corresponding to aperture 52 as compared to a similar sensor in a user interface not including aperture 52. One skilled in the art would recognize that the dielectric constant of air is about four times that of FR4, a material commonly used in the manufacture of printed wiring boards. As such, the presence of aperture 52 and the air gap it can provide between at least portions of first sensor electrode 54 and second sensor electrode 56 has a tendency to reduce the straight-line coupling capacitance between first sensor electrode 54 and second sensor electrode 56 and to "push" electric field E further out of the plane of circuit carrier 50 than might be the case if aperture 52 were absent. This "shaping" of electric field E could increase the sensitivity of the corresponding sensor to a stimulus compared to a similar sensor in a user interface lacking aperture 52.

Figure 10:
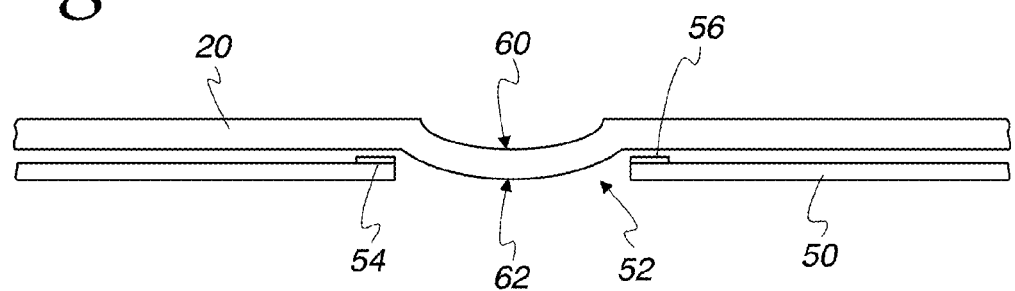
FIG. 10 is a cross-sectional side view of an embodiment of user interface 10 showing a convexly-formed portion 62 of touch surface substrate 20 disposed within aperture 52.

Further, the presence of aperture 52 allows for shaping of touch surface substrate 50 in the vicinity of aperture 52 and the corresponding sensor. For example, with reference to FIG. 10, touch surface 50 could be formed to provide a concavity 60 in the front side thereof proximate aperture 52, thereby providing a tactile feature to aid a user in locating the corresponding operative touch surface and sensor. Forming the touch surface substrate in this manner typically would result in a corresponding convexity 62 at the rear side of the touch surface substrate. At least a portion of the convexity could be accommodated in the void defined by aperture 52, as shown in FIG. 10. Absent aperture 52, it might be necessary to remove convexity 62 (thus locally thinning touch surface substrate 20), to form touch surface substrate 20 in a manner that would not yield the convexity (also locally thinning touch surface substrate 20) or to form circuit carrier 50 in a complementary manner. Any of the foregoing options might increase manufacturing cost and complexity and could degrade the overall integrity and/or performance of user interface 10.

In the FIG. 10 embodiment, discrete graphics layer 30 is omitted. If discrete graphics layer 30 were to be provided in such an embodiment, it preferably would be formable or deformable to accommodate convexity 62. Alternatively, discrete graphics layer 30 could be disposed on the rear side of circuit carrier 50.

The foregoing embodiments are illustrative and not limiting. Although certain features may be discussed in connection with only a particular embodiment, the features of a particular embodiment generally could be used in connection with any other embodiment, as would be recognized by one skilled in the art. One skilled in the art would recognize that the foregoing embodiments could be modified without departing from the scope of the invention.

The invention claimed is:

1. A user interface comprising:
    a touch surface substrate having a front side and a rear side, said touch surface substrate including a light transmissive portion and defining an operative touch surface;
    a circuit carrier having a front side and a rear side, said front side of said circuit carrier associated with said rear side of said touch surface substrate, said circuit carrier defining an aperture therein, said aperture at least partially in registration with said light transmissive portion of said touch surface substrate;
    a sensor comprising a first sensing electrode disposed upon said circuit carrier proximate said aperture, said sensor at least partially in registration with said operative touch surface; and
    a selectively illuminated light source associated with said rear side of said circuit carrier such that light emanating from said light source is visible from said front side of said touch surface substrate at said light transmissive portion of said touch surface substrate;
    with no intervening structure between said rear surface of said circuit carrier and said rear surface of said touch surface substrate through at least a portion of said aperture.

2. The user interface of claim 1 wherein said sensing electrode substantially encompasses said aperture.

3. The user interface of claim 1 wherein said sensor is disposed on the front side of said circuit carrier.

4. The user interface of claim 1 wherein said sensor is disposed on the rear side of said circuit carrier.

5. The user interface of claim 1, said sensor further comprising a second sensing electrode disposed upon said circuit carrier proximate said aperture.

6. The user interface of claim 5 wherein one of said sensing electrodes is disposed on said front side of said circuit carrier and the other of said sensing electrodes is disposed on said rear side of said circuit carrier.

7. The user interface of claim 5 wherein one of said sensing electrodes is a drive electrode and the other of said sensing electrodes is a sense electrode, wherein said drive electrode is disposed between said sense electrode and said light source to provide electrical shielding between said sense electrode and said light source.

8. The user interface of claim 5 wherein each of said sensing electrodes is adjacent to said aperture.

9. The interface of claim 5 further comprising a guard electrode associated with at least one of said first sensing electrode and said second sensing electrode.

10. The user interface of claim 9 wherein said guard electrode at least partially surrounds at least one of said first sensing electrode and said second sensing electrode.

11. The user interface of claim 1 further comprising a graphics layer defining a graphic element having a light-transmissive portion, said light transmissive portion of said graphic element at least partially in registration with said light source and said light-transmissive portion of said touch surface substrate.

12. The user interface of claim 1 wherein said light source is disposed on said rear side of said circuit carrier.

13. The user interface of claim 1 wherein said light source is disposed on a lighting carrier associated with said rear side of said circuit carrier.

14. The user interface of claim 1 further comprising a reflector and/or light guide associated with said light source and adapted to direct light emanating from said light source through said aperture.

15. The user interface of claim 1 wherein said circuit carrier is substantially opaque.

16. The user interface of claim 1 wherein said sensor electrodes are substantially opaque.

17. The user interface of claim 1 wherein said touch surface substrate defines a convexity on said rear surface thereof and in registration with said touch surface, said convexity disposed within said aperture.

* * * * *